United States Patent [19]

Osterman

[11] Patent Number: 4,730,233

[45] Date of Patent: Mar. 8, 1988

[54] ARRANGEMENT IN COOLING CIRCUIT BOARDS

[75] Inventor: Karl F. Osterman, Sundbyberg, Sweden

[73] Assignee: Telefonaktiebolaget LM Ericsson, Stockholm, Sweden

[21] Appl. No.: 882,928

[22] PCT Filed: Nov. 18, 1985

[86] PCT No.: PCT/SE85/00465

§ 371 Date: Jun. 27, 1986

§ 102(e) Date: Jun. 27, 1986

[87] PCT Pub. No.: WO86/03648

PCT Pub. Date: Jun. 19, 1986

[30] Foreign Application Priority Data

Dec. 7, 1984 [SE] Sweden ............................ 8406220

[51] Int. Cl.⁴ ............................................. H05K 7/20
[52] U.S. Cl. ...................................... 361/383; 361/391
[58] Field of Search ................................ 361/381–384, 361/415

[56] References Cited

U.S. PATENT DOCUMENTS

| 3,387,648 | 6/1968 | Ward et al. | 361/384 |
| 4,093,021 | 6/1978 | Groom | 361/384 |
| 4,277,815 | 7/1981 | Skroupa | 361/383 |

FOREIGN PATENT DOCUMENTS

| 2537295 | 4/1976 | Fed. Rep. of Germany | 361/384 |
| 2613366 | 10/1977 | Fed. Rep. of Germany | 361/384 |
| 0721935 | 3/1980 | U.S.S.R. | 361/383 |

Primary Examiner—A. D. Pellinen
Assistant Examiner—Gregory D. Thompson
Attorney, Agent, or Firm—Roberts, Spiecens & Cohen

[57] ABSTRACT

An arrangement for cooling circuit boards (2) which are accommodated in magazines (1) in an cabinet (3). Each magazine is assigned a regulator plate (6) having a plurality of through holes (9,10,11) and/or slots (12), the sizes and positions of which are selected such that the air flows are adjusted to the cooling needs depending on the heat generation of components on the respective boards.

2 Claims, 3 Drawing Figures

U.S. Patent  Mar. 8, 1988  4,730,233
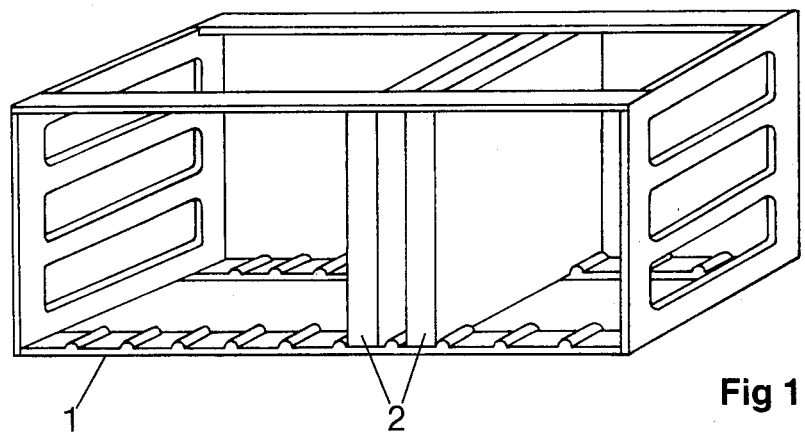
Fig 1
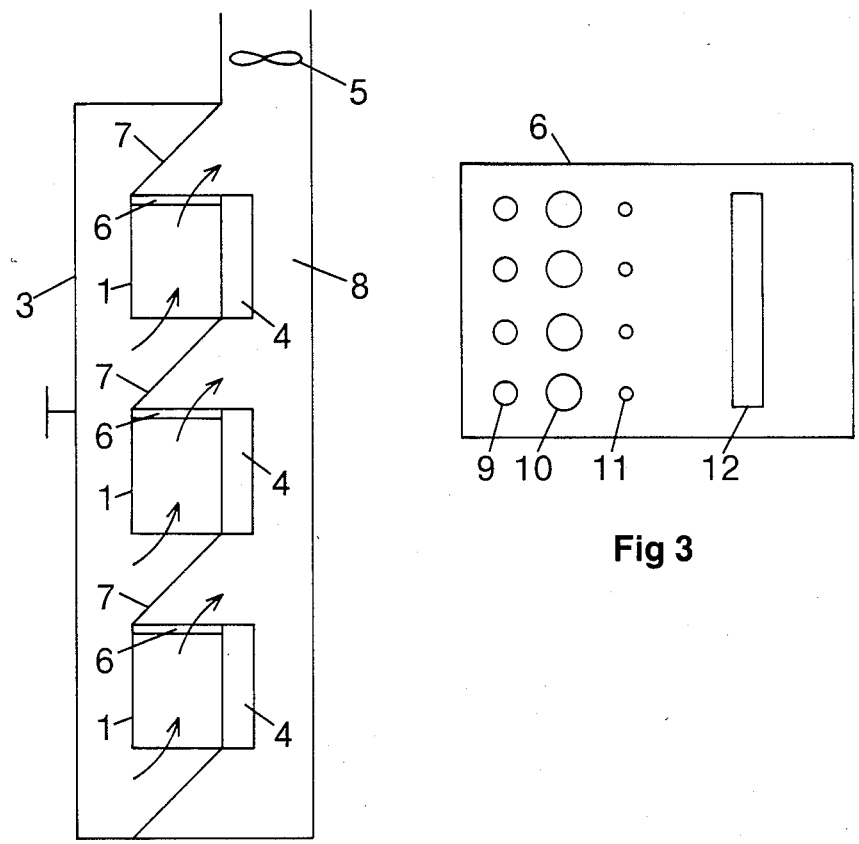
Fig 2
Fig 3

ARRANGEMENT IN COOLING CIRCUIT BOARDS

FIELD OF INVENTION

The invention relates to an arrangement for cooling circuit boards that are positioned in a magazine in a cabinet, in which arrangement air flows between the boards.

BACKGROUND

In modern telephone stations, for example, a large number of magazines containing circuit boards are used, air flowing between the boards to take away the heat generated by the circuit board components. The air can be caused to flow by convection, a draft thus occurring as warm air rises. Forced cooling may also be used, and implemented by mechanical means such as a fan which preferably reinforces the convection draft.

In such an arrangement, a problem may exist that the cooling of certain circuit boards may be insufficient, even if the total air flow through a magazine is nominally large enough. This may result from the fact that whereas the air flows passing close to all the circuit boards are substantially equal, the boards may generate different amounts of heat.

The risk of components or certain boards becoming too hot, and thus being damaged, is especially large if the magazines are placed in a closed cabinet. Further, if a fan is used to increase the air flow, it must be powerful enough to insure that the boards generating the most heat will be sufficiently cooled. Such a fan requires energy as well as space, and can also cause troublesome noise.

SUMMARY OF INVENTION

The object of the present invention is to provide an arrangement of the kind mentioned above, with which the air flows passing along different circuit boards in a magazine may be adjusted to the required cooling effect in response to the heat generation of the respective boards.

This is achieved by the provision of a regulator plate which is assigned to each magazine, and provided with a plurality of holes or slots which, dependent on their sizes and positions, distribute the flowing air in a suitable manner.

BRIEF DESCRIPTION OF DRAWING

The invention will next be described in detail with reference to the drawing in which:

FIG. 1 illustrates a magazine for circuit boards;

FIG. 2 represents a cabinet in cross section and containing a plurality of magazines, one above the other; and FIG. 3 illustrates an inventive regulator plate associated with a magazine provided in accordance with the invention.

DETAILED DESCRIPTION

A magazine for circuit boards is illustrated in FIG. 1. The magazine is denoted by the numeral 1, and has a number of places each intended for a board. For the sake of clarity, only two boards 2 are shown, and these are thrust into and thereby positioned in adjacent places. Such magazines are intended to be in side-by-side arrangement and at different levels above each other in apparatus such as modern telephone exchanges. The magazine is open at top and bottom so that air can pass between the boards and thus lead off the heat generated by components on the boards.

In FIG. 2, there is shown a number of magazines 1, seen in elevation in a cabinet 3. The magazines are placed one above the other at their different levels in the cabinet, in such a way that air can flow between the boards from the bottom of each magazine to its top, or vice versa. The so-called back-planes to which the circuit boards are connected are denoted by 4. The air can flow by free convection or with the aid of a fan 5. The air is supplied, e.g. via unillustrated ducts opening at the sides of the cabinet, and flows upwards in the illustrated embodiment through the magazines via special plates 6, which will be described in connection with FIG. 3. The air that has flowed through a magazine is fed by sloping plates 7 to a flue 8, through which it is led out of the cabinet.

In FIG. 3, there is illustrated an embodiment of a regulator plate 6 of which there may be a plurality, each such plate being associated with its respective magazine. Each plate is manufactured specifically for its associated magazine, taking into consideration the circuit boards included in the magazine. The illustrated regulator plate is provided, for example with a plurality of through holes 9, 10 and 11, and a slot 12. The holes and slot form parallel rows, the mutual spacings of which agree with the spacing between the boards in the magazine.

The plate 6 is intended to be placed on top of a magazine, as is illustrated in FIG. 2, with the holes approximately directly opposite the boards, so that the best cooling effect is attained by the flowing air. The holes in different rows have different sizes, the air flow being thus distributed so that more air passes through the larger holes than through the smaller. Different circuit boards in a magazine will thus be cooled to different extents. Cooling will be greatest for the slot 12, and decreases with decreasing hole size in the different rows of holes. There are no holes opposite empty places in the magazine, so that air does not flow through such places unnecessarily.

The flowing air is thus utilized optimally by such regulator plates, which increases the possibility of obtaining sufficient cooling by free convection or minimizing the necessary fan power.

The invention may of course be varied within the scope of the accompanying claims. For example, the holes do not need to be circular, as shown in the drawing, but may instead be given any suitable configuration. Furthermore, only holes of different sizes or only slots of different sizes may be used, instead of a combination thereof. They can also be optionally arranged in patterns other than straight lines, e.g. zig-zag. It is also conceivable to place the regulator plates under, or in front of the magazines, whereby in these cases the air flows will be be adjusted in a corresponding way.

What is claimed is:

1. Apparatus comprising a cabinet, a plurality of magazines supported in said cabinet in vertically spaced relation one above the other, a plurality of circuit boards supported in each magazine in spaced horizontal relation adjacent to one another such that air flow through the magazines between adjacent boards, and a plate supported in said cabinet above each magazine and through which the air flows after traversing the respective magazine, each plate being provided with rows of aperture means, each row constituted by a plurality of orifices or a slot, said rows extending parallel to said circuit boards and having a spacing corresponding to the spacing of said boards such that each row is disposed above a respective board in opposition thereto, each board generating a respective amount of heat which may differ from that of the other boards, said aperture means in each row being of a size related to the respective amount of heat generated by each board such that the sizes of the aperture means in the different rows may differ from one another to cause the air flow through the rows at the aperture means in each plate to be adjusted to the heat generation in each board.

2. Apparatus as claimed in claim 1 wherein each plate has a portion which is solid and devoid of aperture means wherever a circuit board is absent in the respective magazine.

* * * * *